United States Patent [19]

Kish

[11] Patent Number: 5,410,686
[45] Date of Patent: Apr. 25, 1995

[54] METHODS FOR SCAN PATH DEBUGGING

[75] Inventor: Thomas J. Kish, Chandler, Ariz.

[73] Assignee: Motorola, Inc., Schaumburg, Ill.

[21] Appl. No.: 143,951

[22] Filed: Nov. 1, 1993

[51] Int. Cl.⁶ .......................................... G01R 31/28
[52] U.S. Cl. .................................. 395/575; 371/22.1
[58] Field of Search .............. 395/575; 371/16.1, 16.5, 371/22.3, 29.1, 22.1, 15.1

[56] References Cited

U.S. PATENT DOCUMENTS

| | | | |
|---|---|---|---|
| 4,455,624 | 6/1984 | Haag et al. | 364/900 |
| 4,879,646 | 11/1989 | Iwasaki et al. | 364/200 |
| 5,111,458 | 5/1992 | Hara | 371/16.5 |
| 5,276,862 | 1/1994 | McCulley et al. | 395/575 |

Primary Examiner—Charles E. Atkinson
Attorney, Agent, or Firm—Michael D. Bingham; Walter W. Nielsen

[57] ABSTRACT

A scan path debugger isolates and identifies hardware and software faults in a computer system containing scan path logic. A user can readily define what information is to be examined and in what format. The user can toggle between displaying information in data-aligned format or time-aligned format. The user may temporarily suspend control of the scan path debugger to allow the system to be controlled temporarily by a different, unrelated program. The user can check the operation of the system under different microcode files. The user can also save the complete logic state of the system under test, execute one or more scan path debugger instructions while observing the results, restore the saved state, execute the same or different instructions, and observe the results.

11 Claims, 14 Drawing Sheets

| SCANRING 1 | | | | SCANRING 2 | | | |
|---|---|---|---|---|---|---|---|
| SPD STATE | d_test | IP | val | data | FP | q_num | if_c | busy |
| 1 | 37de | 0013a9e6 | 1035987fea | 00000bea | 874defa3 | 00000014 | e | 018492543f | 0800 |
| 2 | aeb6 | 0013a9e7 | 48cbe27a80 | 00000000 | 00000000 | 00000248 | b | 1049837853 | 0000 |
| 3 | 98ec | 0013a9e8 | 11190abbfe | 00001352 | 0426ba22 | 8a9e7534 | 7 | af8864e823 | 0010 |
| 4 | 3988 | 0013a9e9 | 38592bdf0a | c2991004 | ffef9903 | ffff0000 | 4 | ecf876a823 | 0020 |
| 5 | aa89 | ffef9903 | 87fffbe829 | ffff00fe | 0000008d | 00001209 | f | 596037f3bf | 3303 |
| 6 | 2fff | ffef9904 | fff0001237 | 1123efab | 000000ff | 829efff | 0 | 48672681a6 | af24 |
| ⋮ | ⋮ | ⋮ | ⋮ | ⋮ | ⋮ | ⋮ | ⋮ | ⋮ | ⋮ |

FIG. 7

SAMPLE SCANPATH DEBUGGER FORMAT FILE

DEFINE SCREEN LABELS

```
2,  3, LABEL, "A:      d_test=0x"
2, 30, LABEL, "IP=0x"
2, 50, LABEL, "val=0x"

4,  3, LABEL, "B:      data=0x"
4, 42, LABEL, "FP=0x"

6,  3, LABEL, "C:      q_num=0x"
6, 26, LABEL, "if_c=0x"
6, 50, LABEL, "busy=0x"
```

SELECT DATA OUTPUT
FROM EACH PIPELINE STAGE

```
PIPELINE A
2, 18, scanring, 1, d_test, x
2, 35, scanring, 1, IP, x
2, 56, scanring, 1, val, x PIPELINE B
4, 16, scanring, 1, data, x
4, 47, scanring, 2, FP, x PIPELINE C
6, 17, scanring, 2, q_num, x
6, 33, scanring, 2, if_c, x
2, 57, scanring, 2, busy, x
```

*FIG. 9*

```
                        CLK       A        B         C
                        tx        x
                        tx+1    67  y   68  A(x)   69
DISPLAY LINK POINTER →  tx+2       z       A(y)     B[A(x)]
CURRENT LINK POINTER →  tx+3       t       A(z)     B[A(y)]
```

A:  d_test=0xaa89    IP=0xffef9903    val=0x87fffbe829

B:  data=0xffff00fe   0000008d    FP=0x00001209

C:  q_num=0xf    if_c=0x596037f3bf       busy=0x3303

A: d_test=0x98ec   IP=0x0013a9e8    val=0x11190abbfe

B: data=0xc2991004  ffef9903    FP=0xffff0000

C: q_num=0xf    if_c=0x596037f3bf    busy=0x3303

METHODS FOR SCAN PATH DEBUGGING

RELATED INVENTION

The present invention is related to the following invention which is assigned to the same assignee as the present invention:

"Methods for Debugging a Computer System Using Test Vectors", having Ser. No. 08/148,308, filed concurrently herewith.

TECHNICAL FIELD

This invention relates generally to diagnosing hardware and software faults in a data processing system and, in particular, to various methods for scan path debugging.

BACKGROUND OF THE INVENTION

The present invention has utility in the diagnosis of hardware and/or software faults in data processing systems. The need for fast, accurate, and cost-effective fault-isolation is becoming increasingly critical in the manufacturing, testing, and servicing of complex data processing systems. As circuit boards become larger and more complex, having more components and higher part densities, more sophisticated fault-isolation techniques are required.

A known fault-isolation method involves using test vectors. Various combinations of inputs are applied to a circuit board under test, and the corresponding outputs are examined and compared with the desired outputs. However, known methods of using test vectors are usually not capable of isolating faults to a particular functional area, not to mention a particular component or portion thereof.

Moreover, in known test systems, the user often is limited to the use of "canned" test procedures, so it would be desirable to empower the user with the ability to build and store his or her own customized set of test routines.

The concept of scan path debugging is known in the data processing arts. Scan path debugging provides a comprehensive test and observation tool for complex computer boards or systems. Scan path debugging may be facilitated using off-the-shelf scannable parts, or custom-programmable devices may be manufactured incorporating scan path logic. By incorporating scan path logic into a design, internal data (normally invisible to the user) may be controlled and observed.

Therefore, there is a significant need in the area of computer systems testing and maintenance for a technique which will permit fast, accurate, detailed, flexible, and cost-effective isolation of faults in hardware and software components.

In addition, in the fast-growing area of supercomputers there is a significant need for a method of fault-isolation which permits examination and review of individual stages or threads within a long pipeline of data. For example, in a massively-parallel computer system a pipeline may contain many tokens (e.g. 8), each representing a different computational thread, which are being simultaneously executed. In such a system many more threads (e.g. 32,000) may be active but not executing. It would be very difficult to isolate faults in such a system using known debugging technology, because until now it has not been possible to "deskew" the pipeline, i.e. to examine the data "trail" of a selected individual token as it moves through the pipeline.

Thus there is also a significant need in the area of computer systems testing and maintenance for a technique which allows data to be readily observed as it propagates through successive stages of a pipeline.

SUMMARY OF THE INVENTION

In the present invention there are provided various methods for readily debugging complex data processing systems. In the implementations shown herein, the methods are embodied in a computer program referred to as the Scan Path Debugger (SPD) which is directed to debugging an experimental, massively-parallel computer system developed jointly by Motorola, Inc. and the Massachusetts Institute of Technology known as the Monsoon or *T (pronounced "Start") system.

To begin with, the hardware of the Monsoon data processing system incorporates scan path logic, either through the utilization of off-the-shelf components containing serially-scannable logic or through the design-in of scan path logic in unique components of the Monsoon system.

The major hardware components of the Monsoon system are the processor element (PE) board, the I-Structure (IS) board, and the Switch (SW) board. The Monsoon PE board is implemented as an 8-stage pipeline, and the circuit board has more than 6000 bits of scannable data. The IS board can provide more than 500 bits of scan data. As is known, scan path logic allows the machine state of various hardware components to be sampled non-intrusively. However, with so much scannable data available to be examined, the present invention was required to manage the problem of defining what data is to be examined, how it is to be examined, and when it is to be examined.

The methods of the present invention enable vast quantities of potentially scannable data to be selected, reviewed, and stored by the SPD in order to expedite debugging and fault-isolation of hardware and software problems.

In one embodiment of the invention, the user can create a format file, by which the user can define which information is to be selected for examination and in what format it is to be displayed for review.

In another embodiment of the invention, the user, again by creating a format file, can define how various logic states within a system pipeline are to be selected and displayed. Such information may be displayed either in a data-aligned format referred to as "Trace" mode, or in a time-aligned format referred to as "Normal" mode. In the former format, the historical logic "trail" of a token can be examined. This represents the accumulated history of the token as it moved through the pipeline. In the latter format, the instantaneous state of a designated set of system components can be examined. Moreover, the user can readily toggle between "Trace" mode and "Normal" mode.

In yet another embodiment of the invention, the user can issue a "detach" command for temporarily suspending control of the SPD software to allow a circuit board or logic unit under test to be controlled by a different, unrelated program. When the different program finishes execution, the user can release the suspension with an "attach" command.

In still another embodiment of the invention, the user can utilize the SPD to load one or more microcode files into the logic unit/system under test to check the operation of the unit/system under the control of each different microcode file. This enables logic unit operations to be verified for different microcode versions.

In another embodiment of the invention, the user, using a SAVE NODE STATE command, can save the complete logic state of a logic unit/system under test into a designated file, then execute at least one instruction of the SPD and observe the results. Also, using the RESTORE NODE STATE command, the user can then restore the saved state, execute the same or different instruction, and observe the results.

Thus it is an advantage of the present invention to expedite the debugging and fault-isolation of hardware and software problems in a data processing system.

It is also an advantage of the present invention to provide a fault-isolation method by which a system user may define what information is to be analyzed and how it is to be displayed.

It is also an advantage of the present invention to provide a fault-isolation method by which the accumulated history of a token may be displayed as to how it moved through a processing pipeline.

Yet another advantage of the present invention is to provide a fault-isolation method by which control of the fault-isolation software can be temporarily suspended to allow a circuit board or logic unit under test to be controlled by a different, unrelated program.

It is another advantage of the present invention to provide a fault-isolation method by which a user can load one or more microcode files into the logic unit/system under test to check the operation of the unit/system under the control of each different microcode file, thereby enabling the logic unit operation to be verified for different microcode versions.

It is yet another advantage of the present invention to provide a fault-isolation method by which a user, using a SAVE NODE STATE command, can save the complete logic state of a logic unit/system under test into a designated file, then execute at least one instruction of the SPD and observe the results. Using the RESTORE NODE STATE command, the user can subsequently restore the saved state, execute the same or different instruction, and observe the results.

According to one aspect of the invention, there is provided a method for enabling a user to utilize a computer program in a data processing system to control the internal operation of user-selectable portions of a digital logic system and to observe information representing at least one internal logic state of the system comprising the steps of (a) the user creating a file which specifies the following: (i) parameters specifying the desired information and (ii) parameters for displaying the desired information to the user; (b) the user providing a command to the data processing system to process the file; and (c) the data processing system displaying the information to the user.

According to another aspect of the invention, there is provided a method for enabling a user to utilize a computer program in a data processing system to control and observe the internal operation of a digital logic system comprising a plurality of clocked digital logic units, the method comprising the steps of (a) the user saving the state of each of the clocked digital logic units into a file; (b) the user re-loading the saved logic states into the logic system from the file.

BRIEF DESCRIPTION OF THE DRAWINGS

The invention is pointed out with particularity in the appended claims. However, other features of the invention will become more apparent and the invention will be best understood by referring to the following detailed description in conjunction with the accompanying drawings in which:

FIG. 7 shows an example of the contents of a circular state queue of a scan path debugging system in accordance with the present invention.

FIG. 9 shows a typical display format file of a scan path debugging system in accordance with the present invention.

DETAILED DESCRIPTION OF A PREFERRED EMBODIMENT

Figure 1:
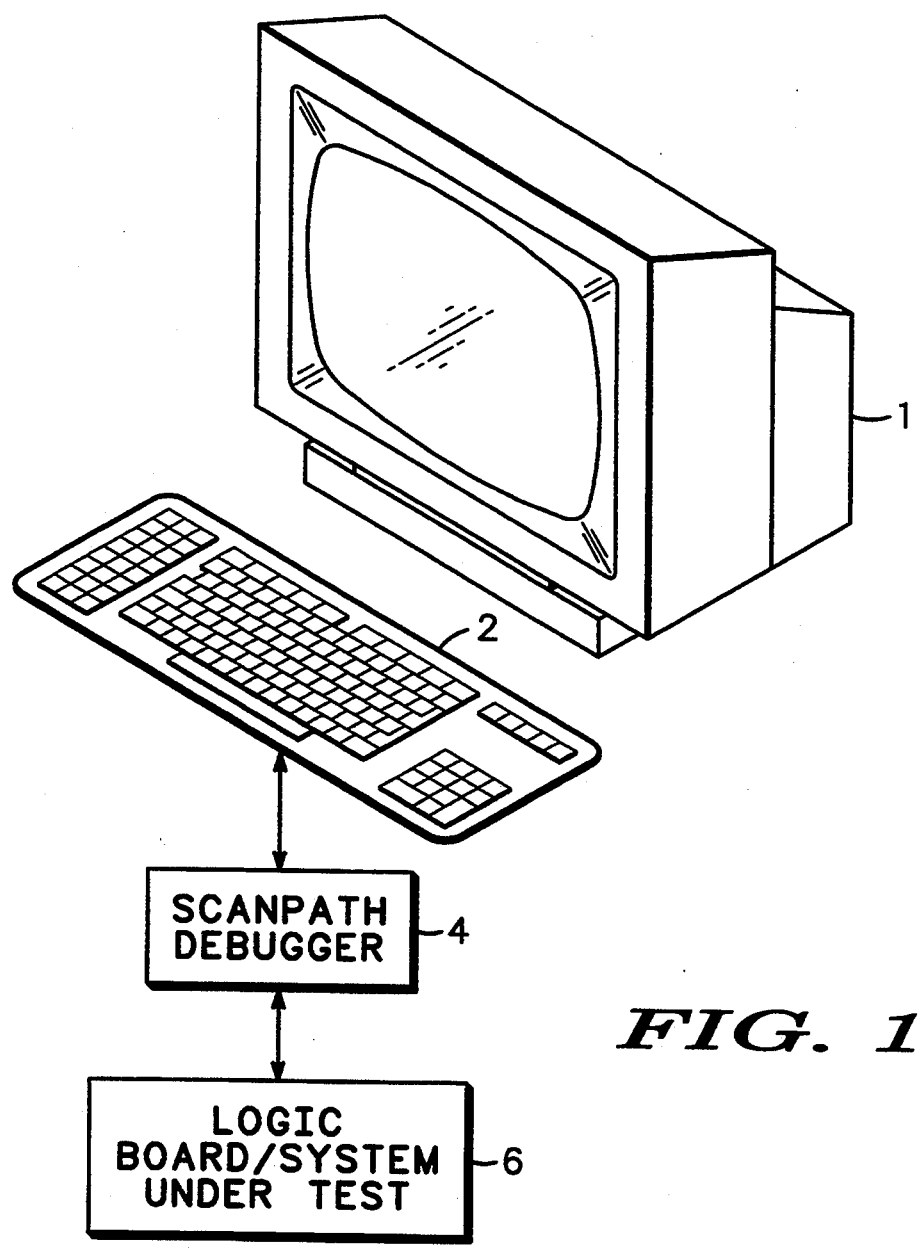
FIG. 1 shows a conceptual block diagram of a scan path debugging system in accordance with the present invention.

FIG. 1 shows a conceptual block diagram of a scan path debugging system in accordance with the present invention. The Scan Path Debugger (SPD), represented by block 4, is coupled both to a logic board or system under test, represented by block 6, and to a user terminal comprising keyboard 2 and video display unit (VDU) 1. By means of keyboard 2, a user may enter data and commands into the SPD and observe the results on VDU 1.

As will be seen from the description below, the SPD is a powerful, extensible tool which permits the user to select hardware stimuli, exposes the hardware for observation, and maintains historical data for pipeline de-skewing. SPD provides this capability as a stand-alone windows-based software program. No additional, special test hardware is required.

Figure 2:
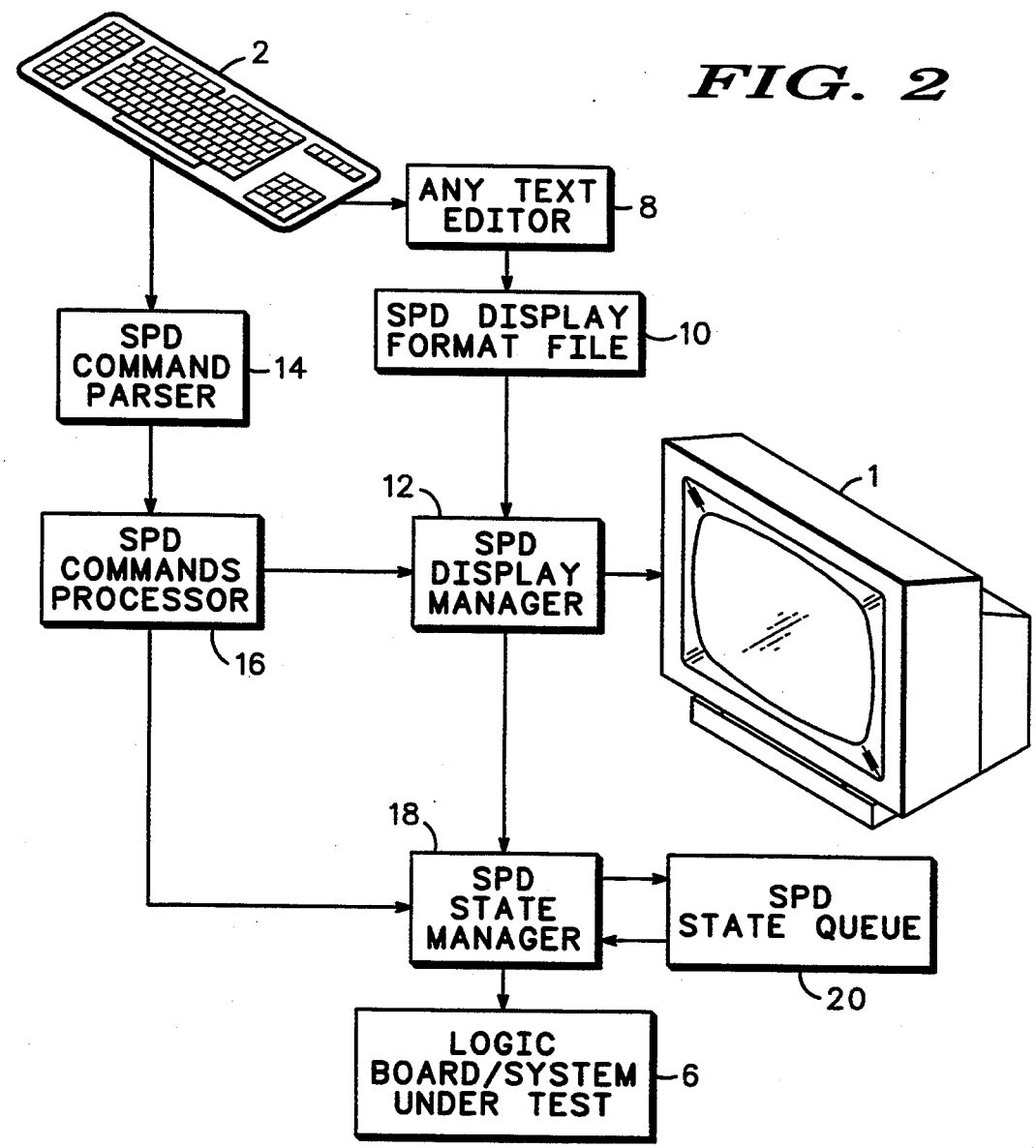
FIG. 2 shows a block diagram of the high-level components of a scan path debugging system in accordance with the present invention.

FIG. 2 shows a block diagram of the high-level components of a scan path debugging system in accordance with the present invention. In addition to keyboard 2 and VDU 1, previously described with reference to FIG. 1 above, the high-level components of the SPD include a Text Editor 8 which may be any appropriate software permitting entry of alpha-numeric information and edit operations thereon by a system user.

The SPD Command Parser 14 interprets all commands entered by the system user, whether in the form of an individual SPD command or an SPD script file. An SPD script file is an ASCII file with an .spd filename extension (optional) that contains individual SPD commands, one per line.

The SPD Commands Processor 16 executes the user's SPD commands on the given logic board or system under test.

The SPD Display Format File 10 is a user-configurable file containing the display format structure.

The SPD State Queue 20 maintains a circular queue of the machine states of the system under test.

The SPD State Manager 18, which is responsive to the SPD Commands Processor 16 and to the SPD State Queue 20, essentially performs two functions: (1) each time the SPD is "stepped" (either manually or auto-stepped) in response to a SNAP command the State Manager 18 increments a pointer in the State Queue 20, takes a "snapshot" of the machine state (i.e. a complete scan path ring "dump"), and writes the state into the State Queue 20; and (2) the state Manager 18 can extract any state that has been stored in the State Queue 20 through a RETRIEVE command.

The SPD Display Manager 12 handles the SPD display output to the VDU 1, and it is responsive to the SPD Display Format File 10, to the SPD Commands Processor, and to the SPD State Manager 18.

The SPD VDU screen comprises five windows. Four of the windows are predefined by SPD for specific purposes; the fifth window is user-defined and may be used to selectively display any of the data available from the logic board or system under test. All displayed information is coordinated by the SPD Display Manager 12 for output on VDU 1.

The reserved windows are used for command line input, status line output (displaying node state, display mode, step count information, error messages, and command help information), and SPD interactive command output.

Figure 3:
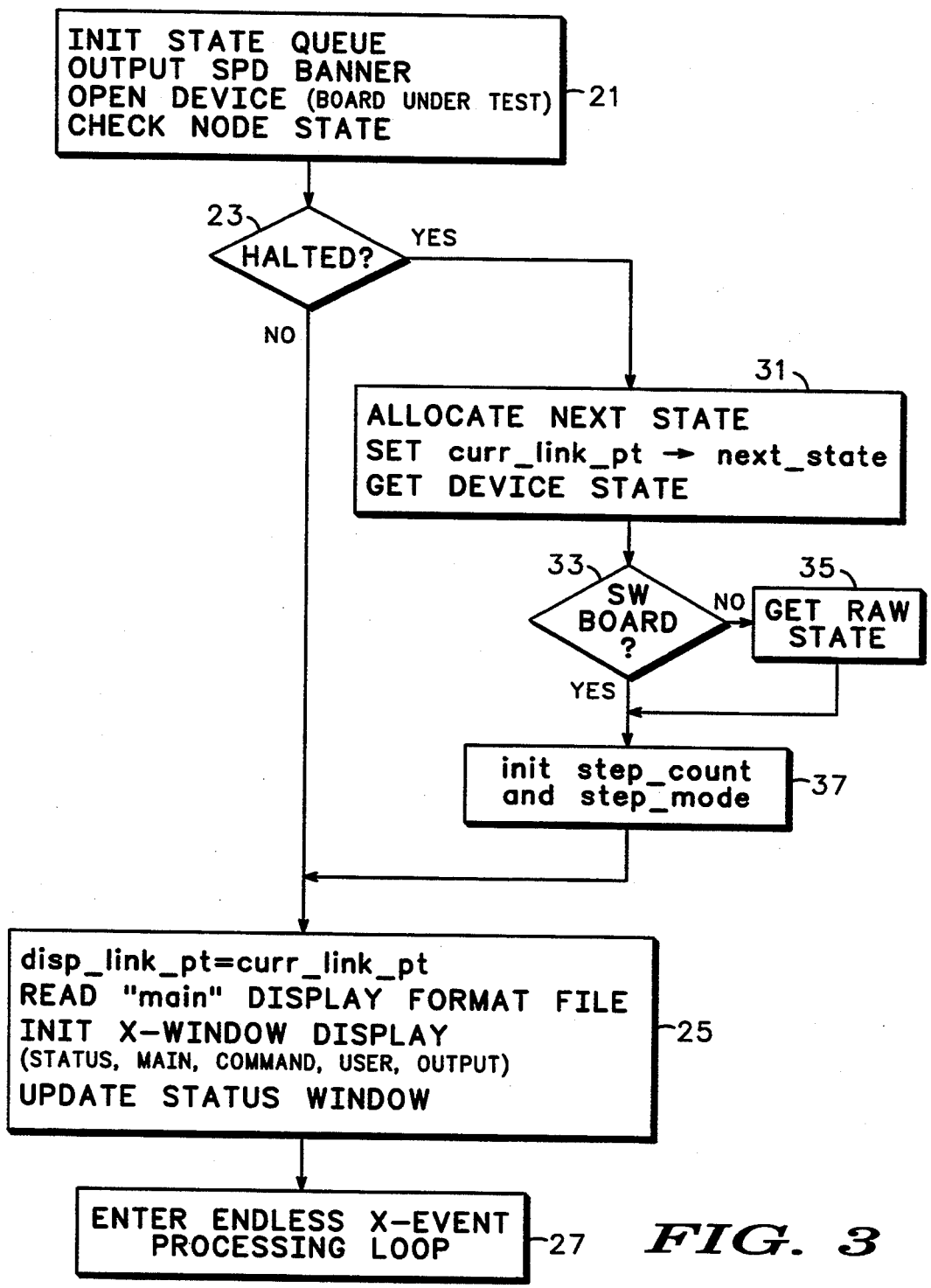
FIG. 3 shows a flow chart of the main line software of a scan path debugging system in accordance with the present invention.

FIG. 3 shows a flow chart of the main line software of a scan path debugging system in accordance with the present invention.

First, regarding box 21, the State Queue 20 is initialized; the SPD banner is output to the VDU 1, the logic board or system under test 6 is opened, and the halt status of the logic board or system under test 6 is checked.

When a logic board or system under test is "opened", the device is readied for access, SPD internal controls are initialized, and a file descriptor is returned. This file descriptor is used for all subsequent communication with the device.

Next, regarding decision box 23, if the logic board or system under test 6 is not halted, the routine proceeds to box 25; but if it's halted, the routine proceeds to box 31.

Separate data pointers are maintained by SPD to allow the user to selectively view historic information. The "$curr_{13}$ link_pt" always points to the "bottom" of the SPD State Queue 20; whereas the "disp_link_pt" (which points to the SPD state from which data is extracted for display) may be adjusted "up" the SPD State Queue to any state saved in the queue.

Regarding box 25, the disp_link_pt is set to the $curr_{13}$ link_pt. The "main" display format file is read; the X-window display is initialized as to status, main, command, user, and output. "Init X-window display" creates the five SPD windows (status, main, command, user, and output) and fills them with data extracted from the SPD State Queue.

The status window is updated. The routine then enters box 27 in which an endless X-event processing loop is performed. SPD is event driven. Once initialization is complete, SPD waits for user commands to be input from the keyboard 2. The commands are processed, the SPD VDU 1 is updated, and SPD then waits for another command. This endless loop continues until the SPD EXIT or QUIT command is issued.

Regarding box 31, the next state is allocated; the $curr_{13}$ link_pt is set to the next_state; and the device state is obtained. The SPD State Manager 18 dynamically allocates host system memory to build the SPD State Queue 20. When SPD is first invoked, if the board or system under test (SUT) is halted, SPD can capture the current state of the SUT via the scanrings. In box 31, memory is allocated, the "$curr_{13}$ link_pt" is set to point to the memory, and the memory is filled with the SUT state.

Next regarding decision box 33, if the logic board or system under test is a Monsoon system Switch board, the routine proceeds to box 37, where the step_count and step_mode are initialized. Step_count is set to zero and step_mode is set to "tokens". The SUT may be manually "stepped" by individual system clocks, or by clock bursts (packets of clocks needed to transfer a "token" of data through a logic block).

Otherwise, the routine proceeds to box 35, where the raw state is obtained, and the routine then goes to box 37 before entering box 25 and box 27.

The SPD State Manager 18 maintains both unformatted and formatted copies of the data extracted from the SUT. The unformatted data is the "raw" data directly extracted from the SUT scanrings; the formatted data is built (from the raw data) to correspond to the signal and bus names on the electronic schematic. This formatted data provides meaningful information to the SPD user.

Figure 4:
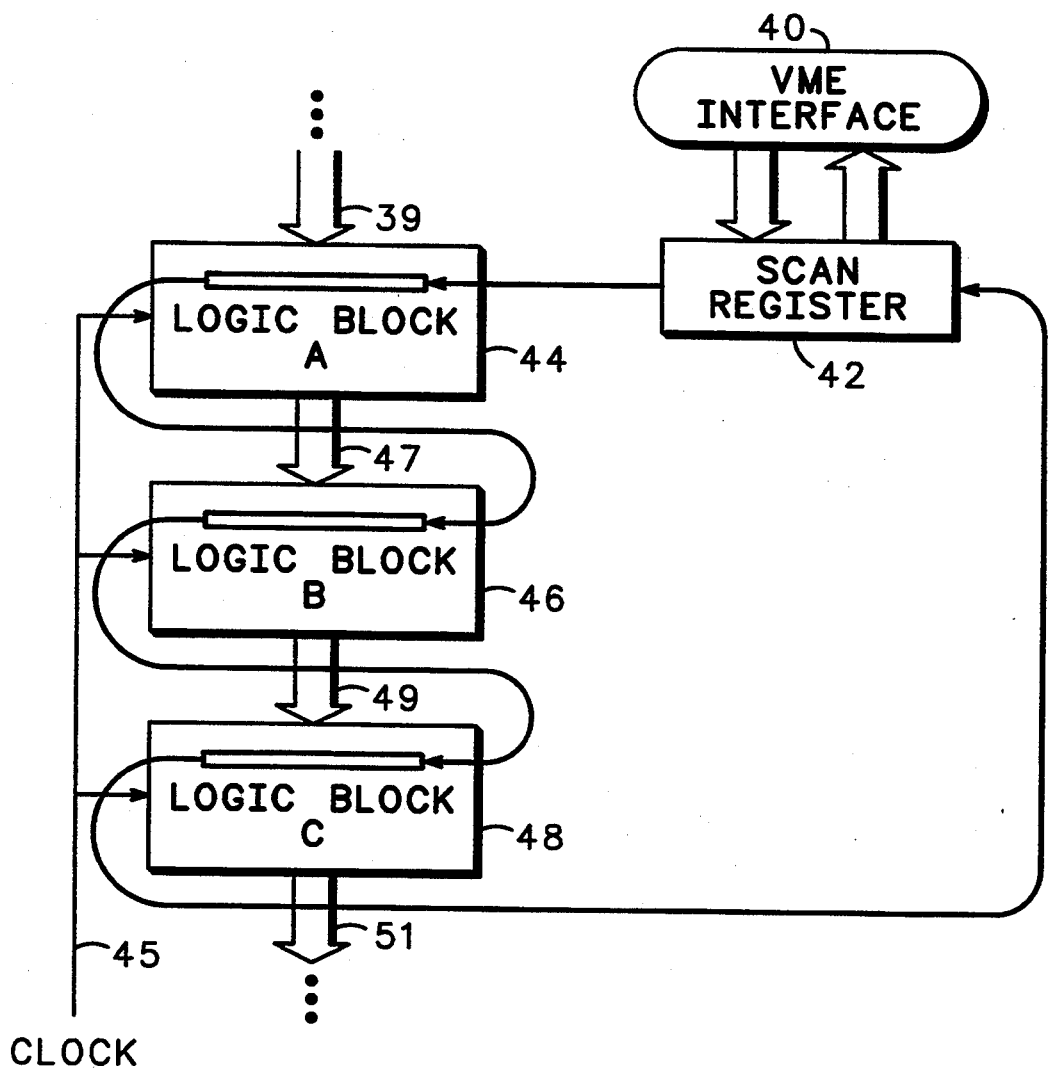
FIG. 4 is a conceptual block diagram illustrating the general operation of a scan register of a scan path debugging system in accordance with the present invention.

FIG. 4 is a conceptual block diagram illustrating the general operation of a scan register of a scan path debugging system in accordance with the present invention.

Each board or system under test includes at least one register which is accessible to the SPD. In the case where the system under test is a Monsoon system, both the PE and IS boards have a SCAN register (42, FIG. 4) which provides controlled accessibility to all external scanrings, including scanrings 0 through 7 of the PE board and all the IS board scanrings. Additionally, the PE board includes 7 internal scanrings associated with the Data Path chip.

The Data Path chip is an eight-stage pipeline byte-sliced 10,000 gate CMOS array. It includes seven internal scanrings. Each scanring is independently accessible through seven separate on-chip registers. Each of the internal scanrings is accessed via separate, independent registers in the SPD system, one for each scanring.

Scanrings

The Monsoon system's scanrings vary in size. For example, the PE scanring #11 is only 6 bytes long, whereas the PE scanring #14 contains 332 bytes. The PE has scanrings #0–#14, and the IS has scanrings #0–#6.

Each scanring contains a number of bits logically divided into multiple fields. The number of bits in each ring is divisible by 8. The bits in each scanring are numbered starting with the bit closest to the beginning of the ring (the LSB). The MSB is the MSB of the most-significant byte in the scanring. The LSB is the LSB of the least-significant byte.

The MSB is the first bit shifted in and the first bit shifted out. The LSB is the last bit shifted in and the last bit shifted out. As a convention, the MSB is designated SDOUTn, where n is the scanring number. The LSB is designated SDINn.

Each scanring can be represented as follows:

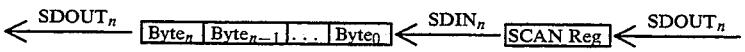

SDOUTn loops back around to the SCAN register serial input. This makes each scanring circular. If the proper number of bytes are read from the scan register, the contents of the scanring will be preserved (i.e. a non-destructive read). The number of reads necessary for a non-destructive read of any scanring is determined by the equation (# reads)=((# bits)/8)+1.

The Data Path chip (DPATH) contains its own 7 scanrings (#8–14) which are accessed through registers internal to the DPATH chip.

As examples of scanrings within the system under test, the PE scanring #0 comprises 3 sub-rings which are used to read/write data into/from the first level decode and route generation memories. It is also used to read data from the token queue memories. The PE scanring #1 comprises 4 sub-rings which are used to read/write data into/from the second level decode memories. The IS scanring #0 comprises 1 sub-ring which is used to read/write the token input register PE Scan Path Register (SCAN)

The external scanrings are accessed via 2 SPD registers: the LCR register and the SCAN register. The LCR and SCAN registers are located in the PE and IS. The least significant 3 bits of the LCR select which scanring to access. Then subsequent reads (or writes) to the SCAN register perform a ring read/rotate (or write/rotate) operation.

The PE scan path register (SCAN) is 32 bits wide of which only the lower 8 bits are used. Write cycles to the SCAN register cause the selected path to be initialized in 8-bit pieces. After the SCAN register is loaded from the system bus, the most significant bit (MSB) of the SCAN register is shifted into the selected ring first, the least significant bit (LSB) last. The MSB of the selected ring is shifted into the SCAN register LSB. N bytes end up in the scanring, where N is the number of bytes in the ring.

Read cycles provide the contents of the SCAN register to the system bus. After the system bus cycle is complete, 8 bits are rotated from the selected ring into the SCAN register. The MSB of the selected ring is shifted through the SCAN register to bit position 7. This provides the same bit order on both reads and writes.

All scanrings are an integral number of bytes in length, with the SCAN register itself considered as an 8-bit piece that is part of every scanring. If all of the bytes in a ring are read (including the SCAN register), the contents of the ring will be the same as before the read was performed (i.e. the read is non-destructive).

A VME interface 40 communicates bidirectionally with scan register 42. A VME interface is present on both the host system and the system under test. This common interface facilitates intersystem communication via the VME bus.

The three logic blocks (A, B, and C), identified respectively by reference numbers 44, 46, and 48, represent concurrently-clocked modules of the logic board or system under test. The large arrows 47 and 49 represent data transferred from one module to the next. Logic blocks 44, 46, and 48 operate in response to clock pulses over line 45.

The input of scan register 42 is received from the output of logic block 48, and the output of scan register 42 is fed to the input of logic block 44. The inputs and outputs of logic blocks 44, 46, and 48 are daisy-chained, so that the output of logic block 44 feeds into the input of logic block 46, and the output of logic block 46 feeds into the input of logic block 48.

In FIG. 4 the dots above arrow 39 and below arrow 51 indicate that the structure of the logic blocks may be arbitrarily extended as needed.

Figure 5:
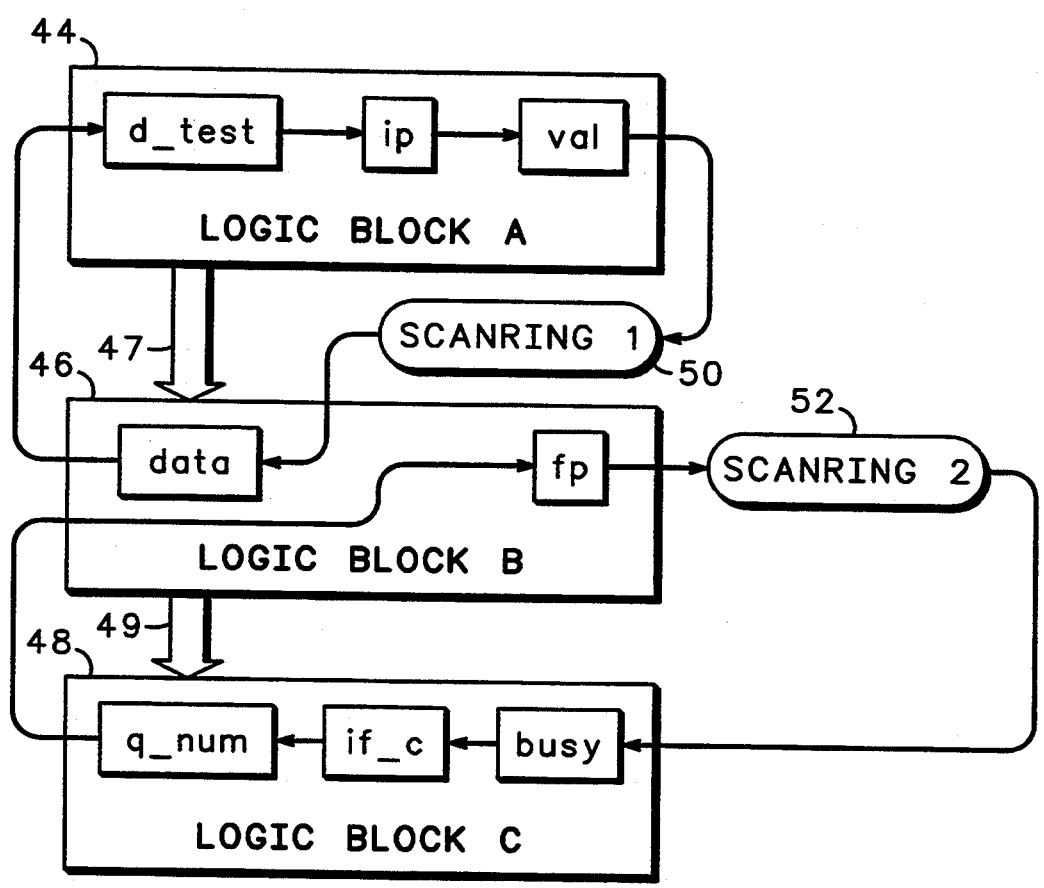
FIG. 5 is a conceptual block diagram illustrating a more detailed operation of a scan register, as applied to a typical logic system under test, in accordance with the present invention.

FIG. 5 is a conceptual block diagram illustrating a more detailed operation of a scan register, as applied to a typical logic system under test, in accordance with the present invention.

As mentioned above the three logic blocks 44, 46, and 48 represent concurrently-clocked modules. The smaller sub-blocks (d_test, IP, val, data, FP, q_num, if_c, busy) represent an example of the logical function of sub-fields within a scanring.

Also shown in FIG. 5 are scanrings 50 and 52. Note that the scanrings are not confined to single logic blocks.

Figure 6:
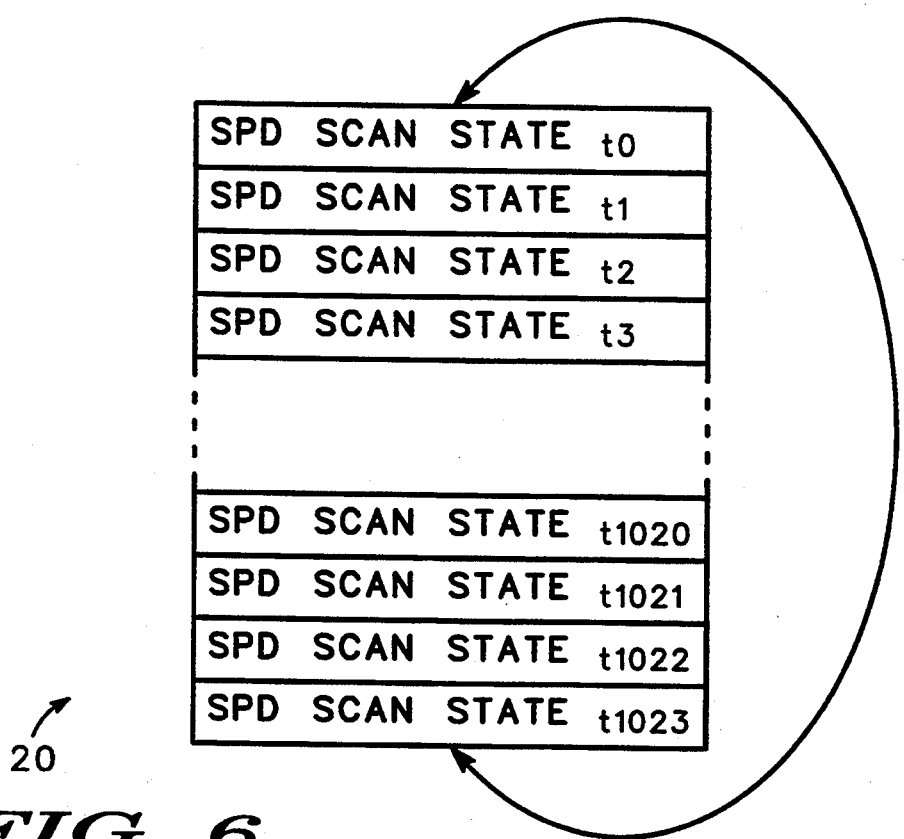
FIG. 6 is a representation of a circular state queue of a scan path debugging system in accordance with the present invention.

FIG. 6 is a representation of a circular state queue 20 of a scan path debugging system in accordance with the present invention. In a preferred embodiment the state queue comprises 1024 elements. In FIG. 6 the top element contains the SPD scan state at a time t0, while the bottom element contains the SPD scan state at a time t1023. The circular state queue maintains a history of raw and formatted node states in the form of a linked list. If the maximum number of states (1024) is exceeded, the oldest state is replaced with the newest state. The SPD uses the SPD State Manager (18, FIG. 2) to maintain the circular state queue. The SPD State Manager 18 dynamically allocates space as needed.

The SPD State Manager 18 includes internal functions to provide convenient machine state extraction. These functions are exploited to facilitate display management for the "Trace" mode (discussed below). When the "Trace" mode is enabled, scan data must be extracted from eight distinct (historical) states. The SPD State Manager 18 handles this with independent display and current state pointers. The position of these pointers are reflected in the SPD status window.

FIG. 7 shows an example of the contents of a circular state queue of a scan path debugging system in accordance with the present invention. The headings "d_test", "IP", "val", and "data" correspond to the sub-blocks shown for scanring 1 in FIG. 5, while headings "FP", "q_num", "if_c", and "busy" correspond to the sub-blocks blocks shown for scanring 2. The contents of SPD states 1–6 of the circular state queue are shown (in hexadecimal form) for each of the above-mentioned sub-blocks.

Display Format File

Figure 8:
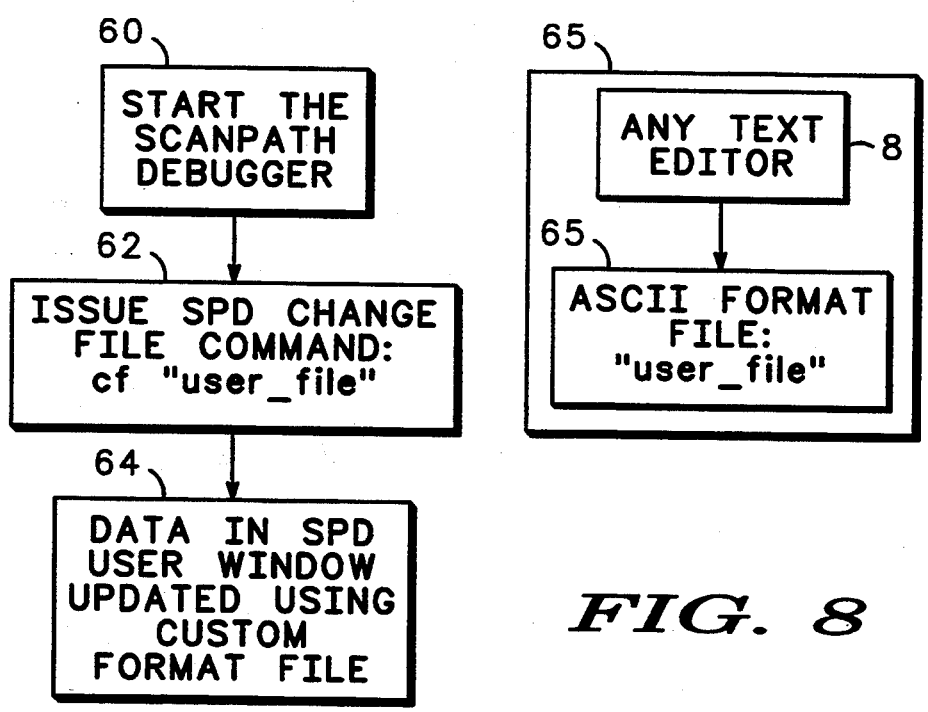
FIG. 8 (supporting claims 1.1–1.4) shows a flow chart of the software for creating a display format file in accordance with the present invention.

FIG. 8 shows a flow chart of the software for creating a display format file in accordance with the present invention.

In box 60 the routine is started. In box 62 the SPD CHANGE FILE command is issued. This command has the form: cf "user_file". The "user_file" is the name of the file (independently created with any ASCII editor) which contains records defining the display content and format.

Finally, in box 64 data in the SPD user window is updated using the custom Display Format File. The user has complete control over what appears in the SPD User-Defined window. Each line in the Display Format File (a plain ASCII-text file), defines what is to be displayed and where it appears on the SPD VDU 1.

Figure 12:
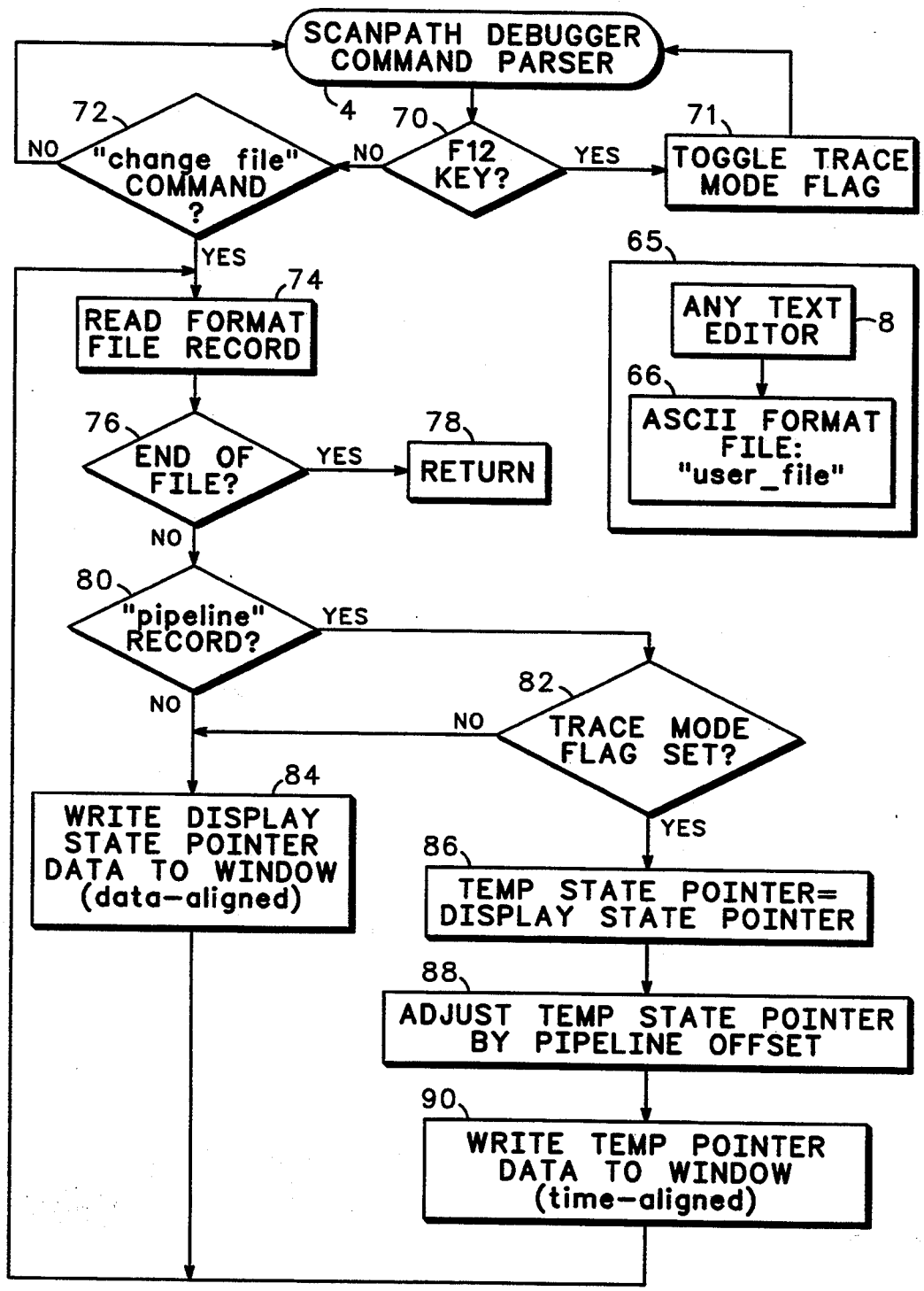
FIG. 12 shows a flow chart of the software for performing a "Trace" mode operation in accordance with the present invention.

With reference to FIGS. 8 and 12, box 65 is shown in isolation to represent that the creation of the ASCII-text Display Format File is completely independent from the operation of SPD. The Display Format File may be created even if SPD is not running; indeed, one can create a Display Format File on an IBM-compatible personal computer or a Macintosh computer and subsequently transfer the file to the host computer for use by SPD.

FIG. 9 shows a typical Display Format File of a scan path debugging system in accordance with the present invention.

In general, the SPD Display Format File 10 contains an arbitrary number of records. Each "record" is a text string containing up to three parameters. One parameter is used to select WHAT is displayed; any data captured in the SPD State Queue 20 may be selected. A second parameter is used to select WHERE data is displayed upon the SPD VDU 1; this is implemented via a (row, column) entry. The third (optional) parameter is used to select HOW the data is displayed; in SPD, data may be displayed in hexadecimal (the default), decimal, or binary format.

The WHAT parameters may specify any or all of the following: arbitrary text strings, pre-defined sub-fields within scanrings, arbitrary bit strings within scanrings, VME register contents, PARC register contents, and data memory contents. The data output from these selections may be displayed anywhere upon the SPD VDU 1.

A user may create the Display Format File in order to control which data is extracted from the SPD State Queue for display. The first two numbers in each line represent the row and column where subsequent output will appear in the user-defined window. The "label" field permits arbitrary strings to be output anywhere within the window.

The special "pipeline" fields inform the SPD of the relationship between each sequentially-clocked logic block.

Any data captured via scanrings may be selected. The scanring field accommodates separate scanring selection. The subsequent numeric argument is the scanring number. Next, the scanring sub-field name appears. This name usually will directly match signal or bus names on the electronic schematic.

The trailing "x" arguments specify that data should be output in hexadecimal format.

Figures 10, 11:
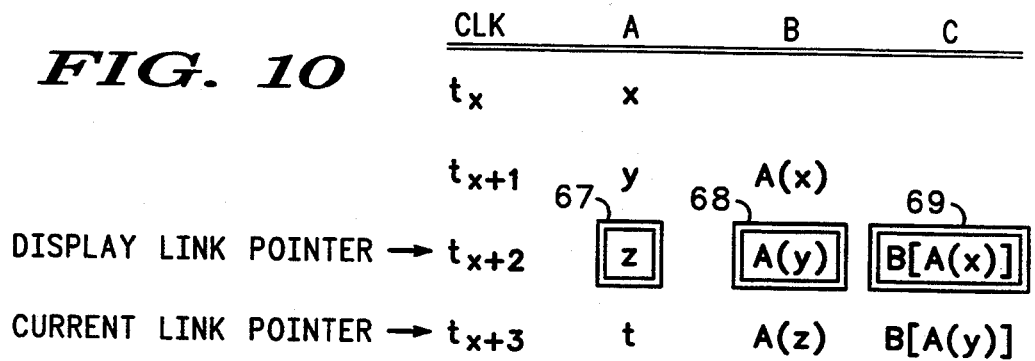
FIG. 10 is a timing chart illustrating a "Normal" mode of scanning data by a scan path debugging system in accordance with the present invention.
FIG. 11 is a representation of a terminal window illustrating the contents of several logic units as provided by a scan path debugging system operating in "Normal" mode, in accordance with the present invention.
Figures 13, 14:
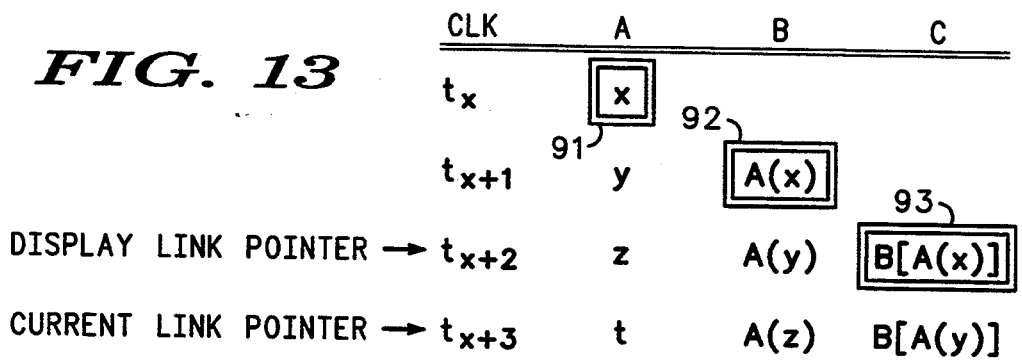
FIG. 13 is a timing chart illustrating a "Trace" mode of scanning data by a scan path debugging system in accordance with the present invention.
FIG. 14 is a representation of a terminal window illustrating the contents of several logic units as provided by a scan path debugging system operating in "Trace" mode, in accordance with the present invention.

As an example, assume the SPD State Queue contains data as shown in the table in FIG. 7. Then, if the SPD CHANGE FILE command were issued with the SPD Display Format File shown in FIG. 9, the user window would appear as shown in FIG. 11. If the SPD TRACE MODE command were issued, the user window would appear as shown in FIG. 14.

"Normal" Mode Operation

FIG. 10 is a timing chart illustrating a "Normal" mode of scan data extraction by a scan path debugging system in accordance with the present invention.

FIG. 10 shows the contents of logic blocks A, B, and C for a succession of clocks tx, tx+1, tx+2, and tx+3. In the example shown, the display link pointer is at clock tx+2, and the current link pointer is at clock tx+3. The display link pointer and the current link pointer need not select the same queue entries.

SPD maintains separate pointers to the "current" state and the "display" state. These are pointers to data in the SPD State Queue 20. The "current" pointer is advanced whenever the SUT is "stepped" (and new data is extracted from the SUT). The "display" pointer may be moved back and forth by the user (via keyboard input) to review historical data preserved by the SPD State Queue 20.

In "Normal" mode the SPD displays the data shown in boxes 67–69. In FIGS. 10, A, B, and C correspond to the logic blocks 44, 46, and 48 shown in FIGS. 4 and 5. The entries in each column represent the data scanned from the inputs of each respective logic block. Standard mathematical function symbology is used to depict the data captured in the SPD State Queue 20 as follows. If Z represents a block of logic, and u represents the inputs to that block of logic, then Z(u) represents the output from logic block Z after receiving a system clock signal. In FIG. 10, the data in boxes 67, 68, and 69 is the data that will be displayed if SPD is in "Normal" mode.

FIG. 11 is a representation of a terminal window illustrating the contents of several logic units as provided by a scan path debugging system operating in "Normal" mode, in accordance with the present invention.

FIG. 11 is an example of what SPD would display in the "Normal" mode provided the SPD State Queue 20 contains the data shown in FIG. 7, the SPD user-defined screen was built using the Display Format File shown in FIG. 9, and the display link pointer is pointing to SPD state 5 in FIG. 7.

For example, in the upper left-hand corner of FIG. 11, the displayed portion "A: d—test=0x" is determined by the third line of the Display Format File shown in FIG. 9, i.e. 2,3,label, "A: d—test=0x". The data "aa89" is determined by the thirteenth line of the Display Format File shown in FIG. 9, i.e. 2,18,scanring,1,d—test,x.

Note that the "aa89" data was extracted from the d—test column (SPD state 5) shown in FIG. 7.

"Trace" Mode Operation

FIG. 12 shows a flow chart of the software for performing a "Trace" mode operation in accordance with the present invention.

The procedure begins in box 4, the Scan Path Debugger Command Parser. In decision box 70 a check is made as to whether the user has depressed a function key (e.g. "Trace" mode/"Normal" mode) on keyboard 2 (FIG. 1), and, if so, the procedure goes to box 71, where the "Trace" mode flag is toggled, indicating as appropriate whether "Trace" mode is enabled or not, and then returns to box 4. If the function key has not been depressed, the procedure goes to decision box 72, where a check is made whether a CHANGE FILE command has been issued by the user; if so, the procedure goes to box 74, where the format file record is read, but if not the procedure returns to box 4.

From box 74 the procedure goes to decision box 76, which checks whether this is the end of the format file record; if so, the procedure returns to box 4, but if not it proceeds to decision box 80, where a check is made as to whether this is a "pipeline" record. The "pipeline" records in the SPD Display Format File inform SPD that all subsequent records (in the Display Format File) describe data contained within one particular logic block. For example, in FIG. 9, the three lines appearing after "pipeline,A" select scan data from logic block A (refer also to FIGS. 4 and 5). If this is a "pipeline" record, the procedure goes to decision box 82, but, if not, it goes to box 84.

In decision box 82 a check is made whether the "Trace" mode flag is set; if so, the procedure goes first to box 86, where the "temp state" pointer is set equal to the "display state" pointer, next to box 88, where the "temp state" pointer is adjusted by the pipeline offset, and then to box 90, where the "temp pointer" data is written to the main and user windows in a time-aligned manner (as shown, for example, in FIG. 14).

The SPD "Trace" mode is facilitated using a special "diagonal data extraction method". Boxes 86, 88, and 90 in FIG. 12 implement this method. Data is read from the SPD State Queue 20 by using a temporary data pointer which is adjusted (from the "display" pointer) by the amount defined by the "pipeline" records in the SPD Display Format File 10. This de-skews the data displayed on the SPD VDU 1 to show the "trail" of information left by a particular input stimulus.

If the "Trace" mode flag is not set, then the procedure goes to box 84, where the display state pointer data is written to the user window in data-aligned fashion. From either box 84 or 90 the procedure returns to box 74.

"Trace" mode is very useful in debugging Monsoon system PE boards. The Monsoon PE board is implemented as an 8-stage pipeline processor. Each of the 8 stages operates on independent instructional threads, so at any given time the 8 tokens contained in the pipeline may be completely unrelated. For diagnostic purposes, it is quite useful to be able to follow the "trail" left by a particular token as it proceeds through the pipeline.

In "Normal" mode the 8 tokens depicted in the SPD main window are 8 independent threads of execution. If a token is stepped to a "form token" stage, "Trace" mode can be activated by the user's depressing the designated function key. "Trace" mode extracts "historical" data from the SPD State Manager, so that the "trail" left by the token in the "form token" stage is displayed. "Trace" mode essentially de-skews the pipeline display so that the entire window is "data-aligned" rather than "time-aligned".

As mentioned above regarding FIG. 8, box 65 is shown in isolation to represent that the creation of the ASCII-text Display Format File is completely independent from the operation of SPD.

To accommodate the SPD "Trace" mode, the Display Format File must include "pipeline" records which inform SPD of the grouping of the logical blocks.

FIG. 13 is a timing chart illustrating a "Trace" mode of scan data extraction by a scan path debugging system in accordance with the present invention. FIG. 13 shows the contents of logic blocks A, B, and C for a succession of clocks tx, tx+1, tx+2, and tx+3. In the example shown, the display link pointer is at clock tx+2, and the current link pointer is at clock tx+3. In "Trace" mode the SPD displays the data shown in boxes 91–93.

As described above regarding FIG. 10, A, B, and C in FIG. 13 correspond to the logic blocks 44, 46, and 48 shown in FIGS. 4 and 5. The entries in each column represent the data scanned from the inputs of each respective logic block. In FIG. 13, the data in boxes 91, 92, and 93 is the data that will be displayed if SPD is in "Trace" mode. SPD performs this diagonal data extraction using the "pipeline" records contained in the SPD Display Format File 10.

As described above, "Trace" mode de-skews the data propagating through the pipeline, enabling the user to observe the trail of results generated by any single data input stimulus. The SPD toggles between "Normal" and "Trace" modes when the user depresses the designated function key on the keyboard.

FIG. 14 is a representation of a user-defined window illustrating the contents of several logic units as provided by a scan path debugging system operating in "Trace" mode, in accordance with the present invention.

FIG. 14 is an example of what SPD would display in the "Trace" mode provided the SPD State Queue 20 contains the data shown in FIG. 7, the SPD user-defined screen was built using the Display Format File shown in FIG. 9, and the display link pointer is pointing to SPD state 5 in FIG. 7.

For example, in the upper left-hand corner of FIG. 11, the displayed portion "A: d—test=0x" is determined by the third line of the Display Format File shown in FIG. 9, i.e. 2,3,label, "A: d—test=0x". The data "98ec" is determined by the thirteenth line of the Display Format File shown in FIG. 9, i.e. 2,18,scanring,1,d—test,x.

Note that the "98ec" data was extracted from the d_test column (SPD state 3) shown in FIG. 7. Since the data was taken from pipeline A (as specified in line 12 of the Display Format File 10 shown in FIG. 9), and there are a total of three pipelines, one must go back two states to obtain the correct historical data.

"DETACH" and "ATTACH" Operation

Figure 15:
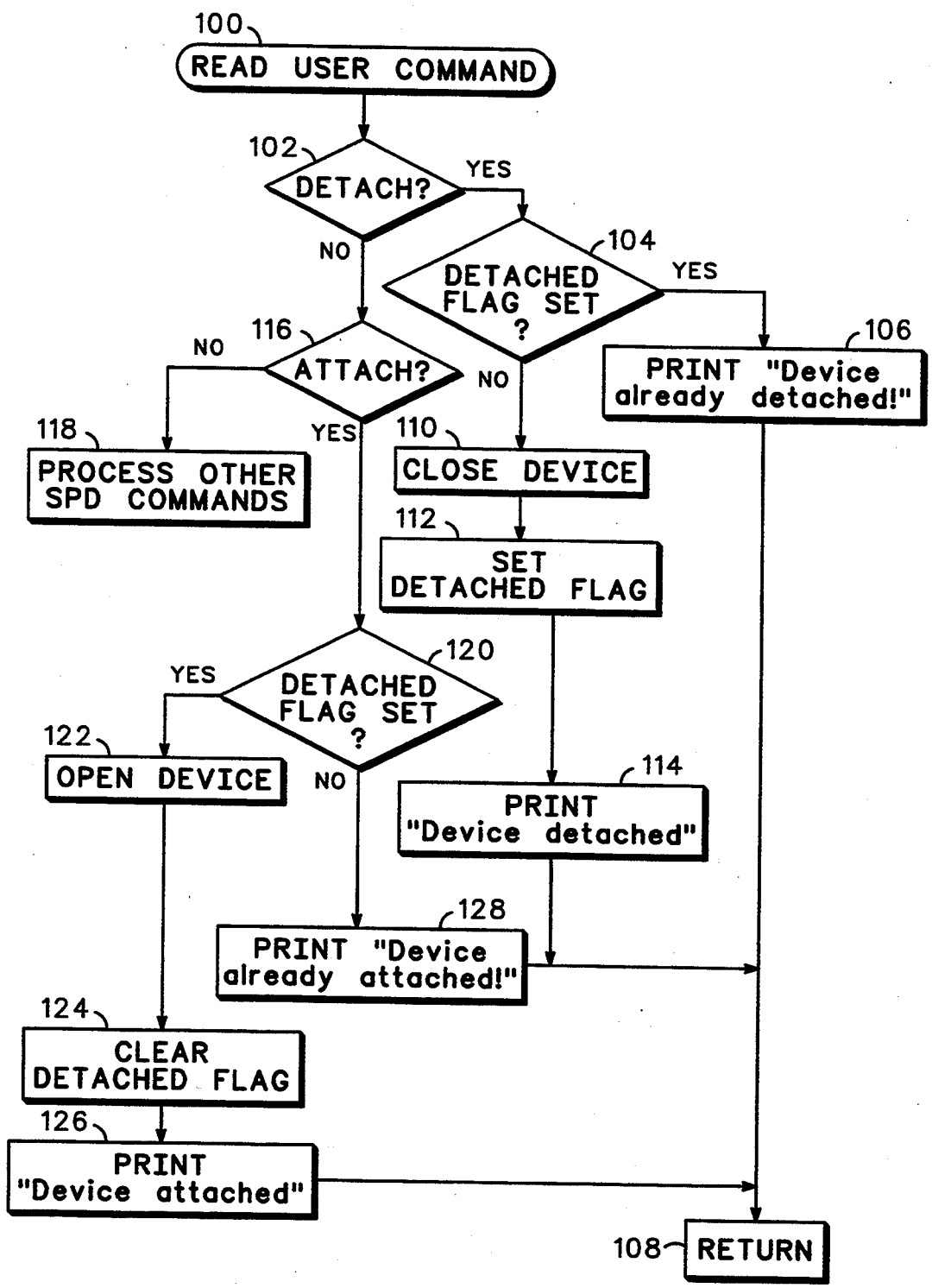
FIG. 15 shows a flow chart of the software illustrating the operation of the DETACH and ATTACH commands in accordance with the present invention.

FIG. 15 shows a flow chart of the software illustrating the operation of the DETACH and ATTACH commands in accordance with the present invention.

Each invocation of SPD may only communicate with one logic board/system under test (SUT). This SUT is the "device" which is "attached" (which provides the SPD with exclusive use of the SUT) or "detached" (allowing any other program to access the SUT).

It should be understood that when the SPD is started, it "attaches" to the logic board/system under test via a file descriptor. The file descriptor is the identifier or "handle" provided by the host system when the board/system under test was "opened" by SPD. This "handle" is used by SPD for all subsequent communication between SPD and the board/system under test.

Once attached, no other program may access the board/system. The SPD DETACH command may be used to "release" the board/system (without exiting SPD) to permit other programs to temporarily access the board/system. For example, the user may execute any desired diagnostic program (e.g., a memory test program) on the SUT. The ATTACH command is then used to re-gain control of the board/system to continue with further SPD operation.

The procedure shown in the flow chart of FIG. 15 starts in box 100, where the user's command is processed and then goes to decision box 102, where a check is made to determine whether this is the DETACH command; if so, the procedure goes to decision box 104, but, if not, it goes to decision box 116.

In decision box 104, if the "DETACHED" flag is set, the procedure goes to box 106, where the notice "DEVICE ALREADY DETACHED" is printed to the user screen, but if it isn't set, the procedure goes to box 110, where the device is closed, then to box 112, where the "DETACHED" flag is set, finally to box 114, where the notice "DEVICE DETACHED" is printed to the user screen.

In decision box 116, a check is made to determine whether this is the ATTACH command; if so, the procedure goes to decision box 120, but, if not, it goes to box 118, where other SPD commands are processed. In decision box 120, a check is made to determine whether the "DETACHED" flag is set; if so, the procedure goes to box 122, but, if not, it goes to box 128, where the notice "DEVICE ALREADY DETACHED" is printed to the user screen.

In box 122 the device is opened, and the procedure goes to box 124, where the "DETACHED" flag is cleared, and finally to box 126, where the notice "DEVICE DETACHED" is printed to the user screen.

The procedure exits from boxes 114, 126, and 128 to the return box 108.

"LOAD MICROCODE" Operation

Figure 16:
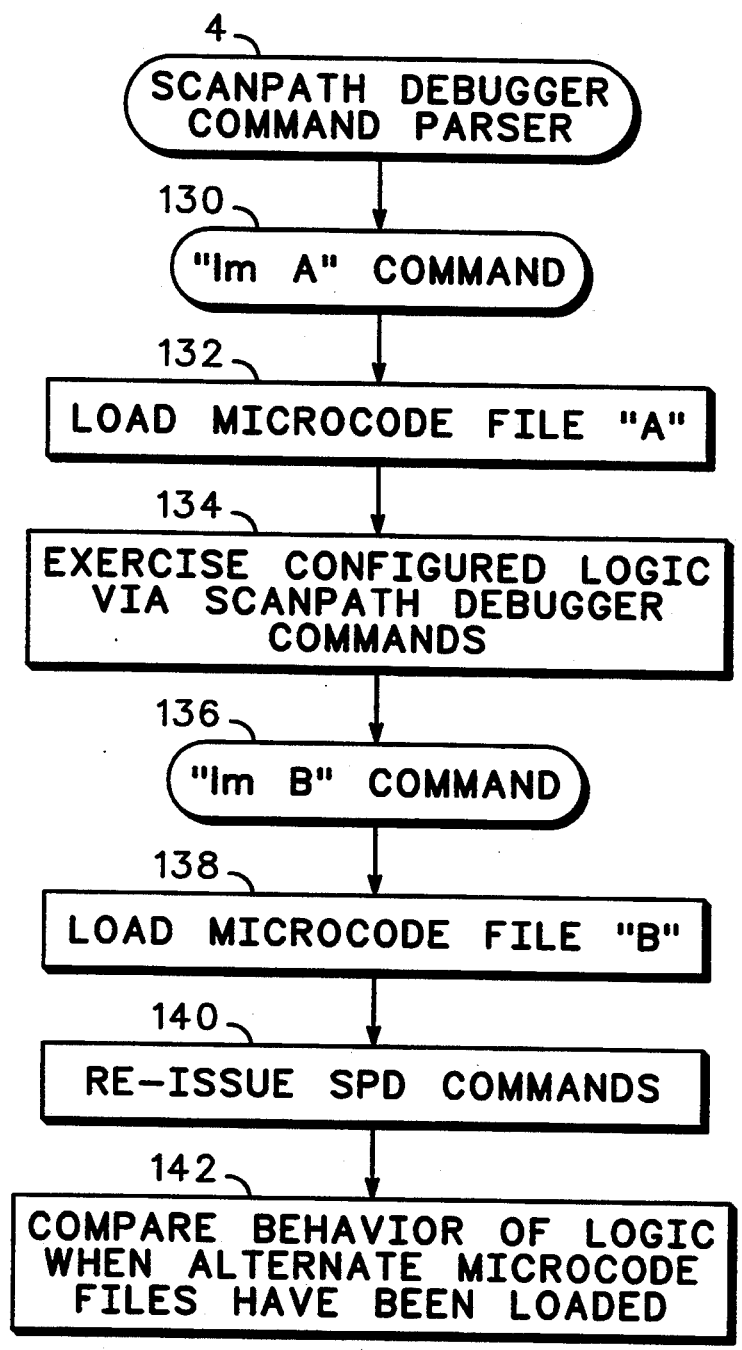
FIG. 16 shows a flow chart of the software illustrating the operation of the LOAD MICROCODE command in accordance with the present invention.

FIG. 16 shows a flow chart of the software illustrating the operation of the LOAD MICROCODE command in accordance with the present invention.

This procedure begins in box 4 and then goes to box 130, where a LOAD MICROCODE "A" command is entered by a user from keyboard 2 (FIG. 1). Next, in box 132, microcode file "A" is loaded. Next, in step 134, the logic configured by microcode file "A" is exercised via SPD commands by the user, either manually or through an SPD script file.

Next (box 136) a LOAD MICROCODE "B" command is entered by the user. Next, in box 138, microcode file "B" is loaded. Next, in step 140, the logic configured by microcode file "B" is exercised via the exact or similar SPD commands to those issued regarding the microcode file "A" Finally, the user compares the behavior of the logic board/system under test when executing microcode file "A" and microcode file "B".

Different microcode files are typically used to establish the logical operation of the hardware. Much of the behavior of the Monsoon PE and IS boards is "programmable" via the microcode files. In normal machine use, a specific microcode file is chosen based upon the particular operation desired. The board is reset; this microcode file is loaded; and then the machine is used as desired. In essence, the board is literally "brain dead" until the microcode file is loaded. Now, when one is testing a questionable board, one deliberately loads different microcode files (which may change the operational behavior of only a small section of the board). Then, one can run simple tests and observe the results. This helps to narrow the scope of a board failure to a specific area of the board.

"SAVE NODE STATE" and "RESTORE NODE STATE" Operation

The SPD SAVE NODE STATE command is used to capture the current state of the SUT and to save the data in a file. The SPD RESTORE NODE STATE command is used to load any SUT from a previously saved state file. These operations have many uses.

For example, a user may be many hours into a debug session and wish to save the current SUT state so he may immediately resume debugging from the same point.

A peculiar board behavior may be observed, and the SUT state may be saved and restored in a different board to compare results.

The SAVE NODE STATE and RESTORE NODE STATE commands may be included in an SPD script file to perform a specific, repeatable test operation.

The SAVE NODE STATE command may be used to build custom test vectors for use with "Vectest", a separate SPD test vector utility program, which is described further in the Related Invention identified above.

Figure 17:
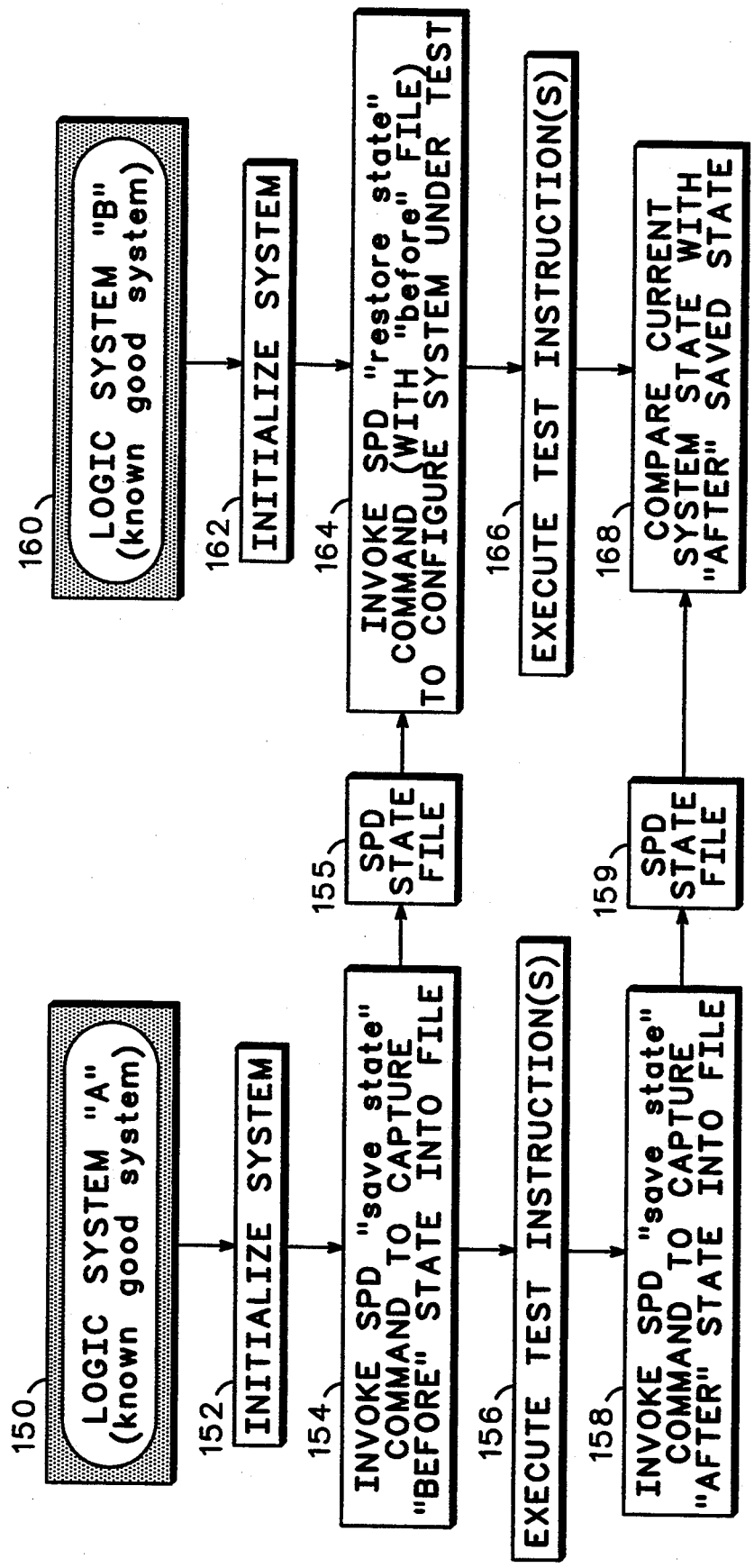
FIG. 17 shows a flow chart of the software illustrating the operation of the SAVE NODE STATE and RESTORE NODE STATE commands in accordance with the present invention.

The SAVE NODE STATE and RESTORE NODE STATE commands may be utilized for at least two purposes. First, they may be used to compare a given SUT with a known good board. FIG. 17 is an example of such a use for the SAVE NODE STATE and RESTORE NODE STATE commands. In this example, two separate boards 150 and 160 are used, as will be explained further below.

In actual practice, once one has determined a given board is good, one runs a utility program which captures thousands of "saved states" into a file. Subsequently, this file may be used freely on "unknown" boards-under-test for fault-isolation.

Secondly, these commands may be used during interactive debugging of a board to capture and preserve board behavior. For example, when debugging an unknown board, at any point in the debug session the state of the board may saved into a file using the SAVE NODE STATE command. Then at any time in the future one may return to this exact debug point by reloading the saved state via the RESTORE NODE STATE command.

As a further example, one can observe the results of loading different versions of microcode into a known good board. For a first version of microcode a specific set of instructions is executed, and the SAVE NODE STATE command is used to capture the board state. Then the operation is repeated for a second version of microcode, the new logic state is saved into a different file, and the two saved files are compared. The files may be compared either by observing any visual differences on the SPD VDU 1 or by using software utility tools to compare the files.

Referring specifically to FIG. 17, a flow chart illustrates the operation of the SAVE NODE STATE and RESTORE NODE STATE commands in accordance with the present invention.

The SPD SAVE NODE STATE command allows the system user to take a "snapshot" of the current logic state of a board/system under test and to save it in a file referred to as the SPD State File, shown in box 155. The SPD State File is a binary file which contains all the information captured from the SUT via the scanrings and VME registers. The SPD State File is written as a binary file to save disk space. It is for SPD internal use only.

The RESTORE NODE STATE command may then be used to restore a previously saved logic state into the board/system under test.

Box 150 represents a known good logic system "A", whereas box 160 represents a logic board/system under test.

First, in steps 152 and 162, the systems are initialized. Next, in box 154 the SPD SAVE NODE STATE command is invoked by the system user. This captures a "BEFORE" state into the SPD State File. The "before" state contains a snapshot of the contents of a board/system before a specific number of clocks have been issued. This SPD "before" state is saved into a file for subsequent use with other boards/systems to be tested.

Then, in box 164 the SPD RESTORE NODE STATE command is issued by the system user, operating on the "BEFORE" file previously captured in the SPD State File for logic system "A". This results in logic system "B" being configured with the contents of the SPD State File.

Next, in step 156 logic system "A" executes various test instructions, while in step 166 logic system "B" also executes the same set of test instructions.

Next, in step 158 the SPD SAVE NODE STATE command is invoked by the system user to capture the "AFTER" state of logic system "A" into the SPD State File. Finally, in box 168 the current state of logic system "B" is compared with the "AFTER" state of logic system "A". Any discrepancies indicate a defect in logic system "B".

Conclusion

It will be appreciated that the present invention therefore provides various methods for readily debugging complex data processing systems. As a result, such systems can be manufactured more quickly and delivered to the purchaser at less cost.

Furthermore, it will be apparent to those skilled in the art that the disclosed invention may be modified in numerous ways and may assume many embodiments other than the preferred form specifically set out and described above.

In addition to customizing SPD via the user-defined window, the user may create powerful, high-level functions by chaining SPD commands within SPD script files. An arbitrary number of SPD commands (complete with parameters) may be written into a text file and "played" through SPD to perform sophisticated operations on a board or logic system.

Also, if an X-window terminal is unavailable, SPD may be executed in the "silent" mode which provides complete scanring accessibility from any computer terminal. This SPD mode is ideal for initializing a multi-node computer system or for running remote diagnostics via modem.

Accordingly, it is intended by the appended claims to cover all modifications of the invention which fall within the true spirit and scope of the invention.

What is claimed is:

1. A method of enabling a user to utilize a computer program in a data processing system to control the propagation of a given data input through successive, clocked digital logic units of a pipeline logic system comprising a plurality of pipeline stages and to observe said propagation of said data input through said logic units, comprising the steps of:
   a. said user creating an ASCII file which specifies selection and display-positioning parameters for information representing at least one internal logic state of said logic system, which file comprises additional parameters which define which portions of said logic units correspond to which pipeline stages of said logic system;
   b. said user providing a command to process said file; and
   c. said data processing system displaying said information to said user.

2. The method recited in claim 1 wherein in step (c) said information can be displayed either in a time-aligned or a data-aligned display.

3. The method recited in claim 2 wherein said time-aligned display depicts the internal logic state of each of said logic units at a single point in time.

4. The method recited in claim 2 wherein said data-aligned display depicts the internal logic state of each of said logic units at user-designated points in time.

5. The method recited in claim 2 and further comprising:
   d. said user alternatively selecting said time-aligned or said data-aligned display.

6. A method for enabling a user to utilize a first computer program in a data processing system to control the internal operation of user-selectable portions of a digital logic system and to observe information representing at least one internal logic state of said system comprising the steps of:
   a. said user observing the operation of said logic system while it is under the control of said first computer program;
   b. said first computer program capturing said at least one internal logic state;
   c. without exiting said first computer program, said user releasing said logic system from said first computer program control;

d. said user placing said logic system under the control of a second computer program and observing the operation of said logic system; and e. said user re-attaching said logic system under control of said first computer program for continued observation by said user;

whereby said at least one logic state is preserved even while said logic system is under control of said second computer program.

7. A method for enabling a user to utilize a computer program in a data processing system to control and observe the internal operation of a digital logic system which operates from microcode comprising the steps of:

a. said user, utilizing said computer program, loading a first microcode file into said logic system to configure a first logical operation;

b. said user executing a first sequence of test instructions to test the operation of said first microcode file;

c. said user, utilizing said computer program, loading a second microcode file into said logic system to configure a second logical operation; and d. said user executing a second sequence of test instructions to test the operation of said second microcode file, whereby the functionality of said logic system is tested by said user for each microcode file.

8. A method for enabling a user to utilize a computer program in a data processing system to control and observe the internal operation of a digital logic system comprising a plurality of clocked digital logic units, which logic system includes certain test parameters, said method comprising the steps of:

a. said user saving the state of each of said clocked digital logic units into a file;

b. said user observing the internal operation of said logic system while said computer program is executing on said data processing system;

c. said user altering said test parameters of said logic system;

d. said user re-loading said saved logic states into said logic system from said file; and e. said user observing the internal operation of said logic system while said computer program is executing on said data processing system.

9. A method for enabling a user to utilize first and second computer programs in a data processing system to control and observe the internal operation of a digital logic system comprising a plurality of clocked digital logic units, said method comprising the steps of:

a. said data processing system executing said first computer program;

b. said user saving the state of each of said clocked digital logic units into a file;

c. said user releasing said logic system from the control of said first computer program;

d. said user placing said logic system under the control of a second computer program and controls and observes the operation of said logic system;

e. said user re-attaching said logic system under control of said first computer program; and f. said user re-loading said saved logic states into said logic system from said file.

10. A method for enabling a user to utilize a computer program in a data processing system to control and observe the internal operation of a digital logic system comprising a plurality of clocked digital logic units, said method comprising the steps of:

a. said data processing system executing said computer program;

b. said user saving the state of each of said clocked digital logic units into a file;

c. said user exiting said computer program;

d. said user restarting said computer program;

e. said user re-loading said saved logic states into said logic system from said file; and f. said data processing system executing said computer program.

11. A method for enabling a user to utilize a computer program in a data processing system to control and observe the internal operation of a digital logic system comprising a plurality of clocked digital logic units, said method comprising the steps of:

a. said data processing system executing said computer program;

b. said user saving the state of each of said clocked digital logic units into a file;

c. said user exiting said computer program;

d. said user replacing said digital logic system with an alternate digital logic system;

e. said user restarting said computer program;

f. said user re-loading said saved logic states into said alternate logic system from said file; and g. said data processing system executing said computer program.

* * * * *